United States Patent
Kawai

(10) Patent No.: US 7,755,060 B2
(45) Date of Patent: Jul. 13, 2010

(54) MULTIPOLE LENS AND METHOD OF FABRICATING SAME

(75) Inventor: Eiji Kawai, Kanagawa (JP)

(73) Assignee: JEOL Ltd., Tokyo (JP)

( * ) Notice: Subject to any disclaimer, the term of this patent is extended or adjusted under 35 U.S.C. 154(b) by 653 days.

(21) Appl. No.: 11/784,698

(22) Filed: Apr. 9, 2007

(65) Prior Publication Data

US 2007/0278416 A1 Dec. 6, 2007

(30) Foreign Application Priority Data

Apr. 13, 2006 (JP) ............................. 2006-110481

(51) Int. Cl.
*G21K 1/093* (2006.01)
*H01J 1/50* (2006.01)
*H01J 3/20* (2006.01)

(52) U.S. Cl. ..................... 250/396 ML; 250/396 R; 335/209; 335/210

(58) Field of Classification Search ............. 250/396 R, 250/396 ML, 492.1, 492.3; 335/210, 209, 335/229, 211, 213, 214
See application file for complete search history.

(56) References Cited

U.S. PATENT DOCUMENTS

| | | | | |
|---|---|---|---|---|
| 3,717,785 A | * | 2/1973 | Guernet | ............ 250/396 R |
| 5,731,586 A | * | 3/1998 | Takashima | ............ 250/396 ML |
| 6,194,730 B1 | * | 2/2001 | Chalupka et al. | ......... 250/396 R |
| 6,272,729 B1 | * | 8/2001 | Reznik et al. | .................. 29/598 |
| 6,281,508 B1 | * | 8/2001 | Lee et al. | ................ 250/396 R |
| 6,946,663 B2 | | 9/2005 | Kawai | |
| 7,012,261 B2 | | 3/2006 | Kawai | |
| 2001/0054688 A1 | * | 12/2001 | Waki | .......................... 250/294 |
| 2003/0137919 A1 | * | 7/2003 | Inui et al. | .............. 369/112.24 |
| 2004/0251423 A1 | * | 12/2004 | Kawai | .................... 250/396 R |
| 2008/0054184 A1 | * | 3/2008 | Knippelmeyer et al. | ..... 250/396 ML |

FOREIGN PATENT DOCUMENTS

| JP | 2230647 | 9/1990 |
|---|---|---|
| JP | 200519071 | 1/2005 |

* cited by examiner

*Primary Examiner*—Jack I Berman
*Assistant Examiner*—Nicole Ippolito Rausch
(74) *Attorney, Agent, or Firm*—The Webb Law Firm

(57) ABSTRACT

There is disclosed a multipole lens that can be machined with improved accuracy. A method of fabricating this lens is also disclosed. The multipole lens has a blank material from which polar elements will be fabricated. The blank material is sandwiched vertically between two layers of film-like insulator. The blank material and the two layers of film-like insulator are sandwiched vertically between an upper ring and a lower ring. These members are provided with injection holes for injecting a curing agent. The injection holes of these members are aligned. The curing agent is injected into the holes and cured. Then, the blank material is machined by electric discharge machining to form the polar elements.

7 Claims, 10 Drawing Sheets

MULTIPOLE LENS AND METHOD OF FABRICATING SAME

BACKGROUND OF THE INVENTION

1. Field of the Invention

The present invention relates to a multipole lens and also to a method of fabricating it.

2. Description of Related Art

In imaging apparatus, such as a scanning electron microscope, when a specimen is irradiated with an electron beam that is a charged-particle beam, aberration in the beam is corrected in order to image the specimen appropriately. In such an imaging apparatus, a multipole lens is mounted as an aberration corrector for correcting aberration in the electron beam.

A known structure of this multipole lens is described, for example, in JP2-230647, where plural (e.g., 8 or 12) polar elements are mounted. The polar elements are supported by an annular holding member and by a yoke disposed outside the holding member.

The multipole lens described in JP2-230647 has plural polar elements, a beam tube, and an annular yoke disposed outside the beam tube. Each of the polar elements consists of a mounting rod and a magnetic polepiece coupled to the front end of the rod. The beam tube is provided with airtight holes through which the mounting rods of the polar elements are passed.

Each polar element is fabricated by screwing the front-end portion of the mounting rod into the magnetic polepiece or by adhesively bonding or welding the front-end portion to the polepiece. The mounting rod and polepiece constituting the polar element are made of a magnetic material. The beam tube is made of an electrically insulating material. A metal coating is formed around each airtight hole.

The mounting rod of each polar element is firmly connected to the yoke at its base-end portion. In particular, the mounting rod is passed through the corresponding hole in the yoke via an insulator such that the rod is aligned along a straight line. Under this condition, the rod is firmly connected to the yoke. The mounting rod is airtightly and rigidly mounted within the airtight hole in the tube by welding that is done via the metal coating. Consequently, the weldment forms a sealably enclosed body.

A coil is mounted in the portion located between the beam tube of the mounting rod and the yoke. The polepiece joined to the front-end portion of the mounting rod is magnetically energized by passing electrical current through the coil.

A method of fabricating a multipole lens having previously-shaped front end forms by molding multipolar elements from a resin and a structure of the multipole lens are known as described, for example, in JP2005-19071.

The multipole lens described in JP2005-19071 has polar elements, an annular holding member for holding the polar elements, and an annular yoke disposed outside the holding member. Each polar element consists of a magnetic polepiece and a support rod. Each polar element is made up of the support rod and the magnetic polepiece mounted to the front end of the rod. The support rod and polepiece are made of a magnetic material, such as Permalloy or iron.

The held portions of the support rod which constitute the polar elements are inserted into through-holes formed in the holding member that is made of a nonmagnetic material, such as brass or phosphor bronze. Seal members, such as O-rings, are disposed at both ends of each through-hole. Inside each through-hole, the space between the outer surface of the held portion of the support rod and the inner surface of the through-hole is filled with a resin. The resin is cured inside the space formed in the through-hole. Consequently, the held portion of the support rod is firmly mounted inside the through-hole formed in the holding member via the cured resin. As a result, the polar elements are placed in position relative to the holding member at the held portions. Under this condition, the polar elements are fixed.

When a coil that is a heating element is placed in a vacuum, the ambient pressure is increased or the amount of hydrocarbons in the residual gas is increased. To prevent this phenomenon, the coil must be placed on the atmospheric side. Therefore, the coil is so disposed that its core is placed on the atmospheric side of the polar elements extending through the vacuum partition wall.

The vacuum partition wall has such a shape that it provides an assembly reference in stacking plural multipolar elements while securing positional accuracy among them. For example, this assembly reference provides a shape for securing coaxiality with other multipolar elements. A shape convenient for obtaining coaxiality is a circular form. This assembly reference needs to have a high positional accuracy with the shape of the front end of each polar element.

Shaping the front end of each polar element by wire electric discharge machining is convenient to uniformly machine the shape of each polar element, taken across an arbitrary cross section perpendicular to the optical axis. Furthermore, electric discharge machining needs to be used to machine a workpiece without producing distortion in it. From these viewpoints, the shape of the front end of each polar element needs to be machined by wire electric discharge machining.

However, machining of a circular assembly reference using wire electric discharge machining is impossible to perform because of interference with the polar elements on the atmospheric side. When the workpiece is reinstalled on the machine tool for plural machining steps, machining errors will be accumulated. To prevent this accumulation, the workpiece is ideally machined in a single machining step.

Because of the reasons described so far, in the prior-art technique, the step for machining an assembly reference cannot be made common with the step for machining of the front end of each polar element. Therefore, it is necessary that alignment be made with a previously-shaped assembly reference and that the front end of each polar element be machined. The positioning error is added to the error produced between the assembly reference and the shape of the front end of each polar element. For example, accumulation of these errors will deteriorate the following kinds of accuracy:

1) coaxiality between the center of the multipolar element and the circular shape of the assembly reference, 2) orthogonality between the assembly reference end surface of a single stage of multipolar element and the center axis of the multipolar element.

Where polar elements whose front ends have been previously shaped accurately are assembled, the following kinds of accuracy are deteriorated in addition to the kinds of accuracy 1) and 2) described above:

3) flatness of the end surfaces of the polar elements.

That is, the individual polar elements become nonuniform in the end surface position. There are other problems. Where a blank member shaped into polar elements is adhesively bonded to a metal member (JP2005-19071), it is difficult to determine the position of the blank member because of positional deviation occurring during the adhesive bonding. The blank member is a workpiece to be machined by electric discharging. Where a blank member is brazed to a ceramic material (JP2-230647), it is impossible to machine ceramic assembly references by electric discharging.

SUMMARY OF THE INVENTION

It is an object of the present invention to provide a multipole lens that can be machined at improved accuracy. It is another object of the present invention to provide a method of fabricating this multipole lens.

A multipole lens according to a first embodiment of the present invention comprises: a blank material from which polar elements will be fabricated; two layers of film-like insulating material between which the blank material is sandwiched vertically; and two rings between which the blank material and the layers of film-like insulating material are sandwiched vertically. These components are provided with common, aligned holes for injecting a curing agent. The curing agent is injected into the holes and cured, and the blank material is machined by electric discharging. Thus, the polar elements are shaped.

A second embodiment of the present invention is based on the first embodiment and further characterized in that the terminal ends of the polar elements are machined planarly.

A third embodiment of the present invention is based on the first embodiment and further characterized in that each of the rings is provided with at least one positioning slot.

A fourth embodiment of the present invention is based on the first embodiment and further characterized in that a housing is cylindrically arranged outside the polar elements and that the housing is provided with through-holes. The front ends of cores are designed to come into contact with the polar elements. The front ends of the cores are machined spherically or conically and come into contact with the terminal ends of the polar elements.

A fifth embodiment of the present invention is based on the first embodiment and further characterized in that the holes for injecting the curing agent are threaded holes and that the multipole lens is fixed with screws instead of the curing agent.

A sixth embodiment of the present invention is based on the fifth embodiment and further characterized in that the insulating material and metal members close to the insulating material are so arranged that a beam of charged particles can view neither the insulating material nor the metal members.

A seventh embodiment of the present invention provides a method of fabricating a multipole lens, the method comprising the steps of: placing a first film-like insulating material over a first ring, the insulating material having holes; preparing a blank material from which polar elements will be fabricated, the blank material having holes; placing the blank material over the first insulating material; placing a second film-like insulating material over the blank material, the second insulating material having holes; placing a second ring over the second insulating material, the second ring having holes; placing the first ring, the first insulating material, the blank material, the second insulating material, and the second ring as layers such that their holes are aligned; injecting a curing agent into the aligned holes and curing the curing agent; and then machining the blank material by electric discharge machining to form the polar elements.

According to the first embodiment of the present invention, the front ends of the polar elements and the assembly reference of the multipolar element are machined in one process step. Consequently, the positional deviation between the front end of each polar element and the assembly reference can be reduced to a minimum. The positional accuracy of the field produced by the multipolar element can be improved. Furthermore, the positional accuracy of the multipolar element in the heightwise direction can be made high easily, because resinous film is used as the material for insulating the polar elements.

According to the second embodiment of the present invention, the terminal ends of the polar elements are machined planarly. This can reduce the magnetic resistance of the portions of the cores that are placed in contact with the terminal ends of the polar elements. Furthermore, variations in magnetic resistance between the individual polar elements can be reduced.

According to the third embodiment of the present invention, one or more positioning slots are formed. Therefore, any one of the slots providing high positional accuracy with the azimuthal orientation of the polar elements can be selected during assembly. The accuracy of the azimuthal angle of the polar elements can be enhanced.

According to the fourth embodiment of the present invention, the front ends of the cores are shaped spherically or conically. This can reduce variations in magnetic resistance between the portions of the cores that are magnetically coupled to the polar elements.

According to the fifth embodiment of the present invention, during fabrication of the multipole lens, the layers can be fixed with screws instead of cured curing agent.

According to the sixth embodiment of the present invention, a function of disabling the beam of charged particles from viewing the insulating material or metal materials close to the insulating material is imparted to the screws. This function is herein referred to as the labyrinth function.

According to the seventh embodiment of the present invention, the positional deviation between the front end of each polar element and the assembly reference can be reduced to a minimum by machining the front ends of the multipolar elements and the assembly reference of the multipolar element in one process step. The positional accuracy of the field produced by the polar elements can be improved. Furthermore, the positional accuracy of the polar elements in the heightwise direction can be easily made high, because resinous film is used as the material for insulating the polar elements.

Other objects and features of the present invention will appear in the course of the description thereof, which follows.

DESCRIPTION OF THE PREFERRED EMBODIMENTS

Embodiments of the present invention are hereinafter described in detail with reference to the drawings.

Embodiment 1

Figure 1C:
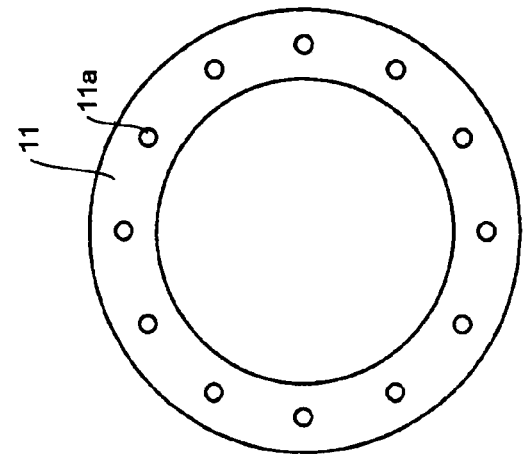
FIGS. 1(a) through 1(l) illustrate a procedure for assembling a blank member.
Figure 1B:
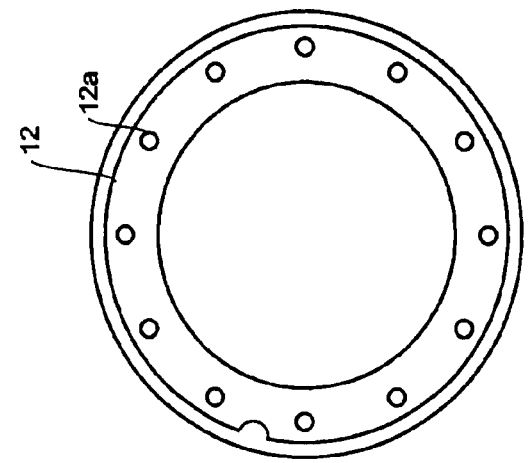
Figure 1A:
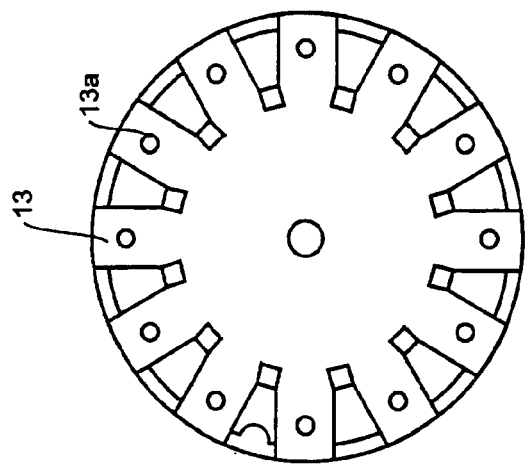

A procedure for assembling a blank member that is a workpiece machined by electric discharging is described by referring to FIGS. 1(a) through 1(f). Step 1 is shown in FIG. 1(a). A ring 11 is made of a nonmagnetic material, such as a copper alloy. The ring 11 is provided with holes 11a for injecting a curing agent 14 (described later). In the following description, the curing agent is an epoxy resin curing agent. Step 2 is shown in FIG. 1(b). A film-like insulating material (hereinafter referred to as the insulator) 12 is placed on the ring 11. The insulator 12 is provided with holes 12a for injecting the curing agent. In this case, the holes 12a are aligned with the holes 11a in the ring 11.

Step 3 is shown in FIG. 1(c). A blank material 13 from which polar elements will be fabricated is made of a soft magnetic material. The blank material 13 is provided with holes 13a for injecting the epoxy resin curing agent. The blank material 13 is placed on the insulator 12 such that the holes 13a are aligned with the holes 12a.

Figure 1F:
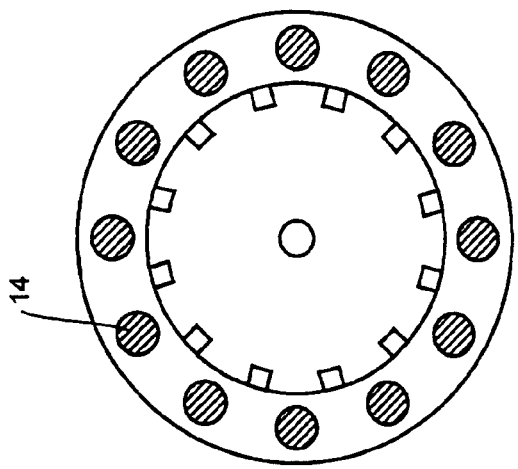
Figure 1E:
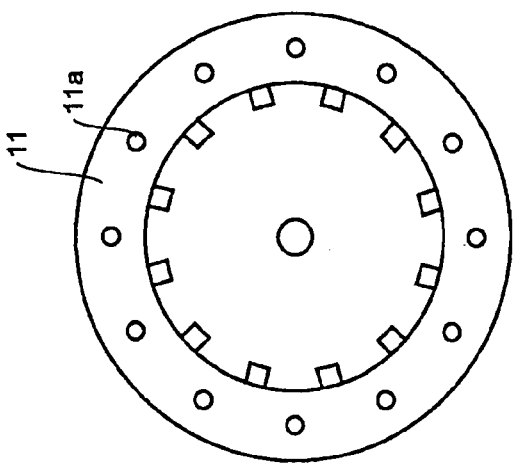
Figure 1D:
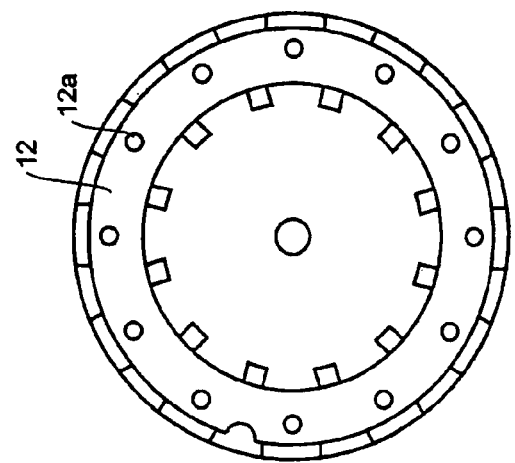

Step 4 is shown in FIG. 1(d). In this step 4, a second insulator 12 is placed on the blank material 13 such that holes 12a formed in the second insulator 12 are aligned with the respective holes 13a.

Step 5 is shown in FIG. 1(e). A second ring 11 is placed on the second insulator 12 such that holes 11a formed in the ring 11 for injecting the epoxy resin curing agent are aligned with the respective underlying holes 12a.

Figure 1I:
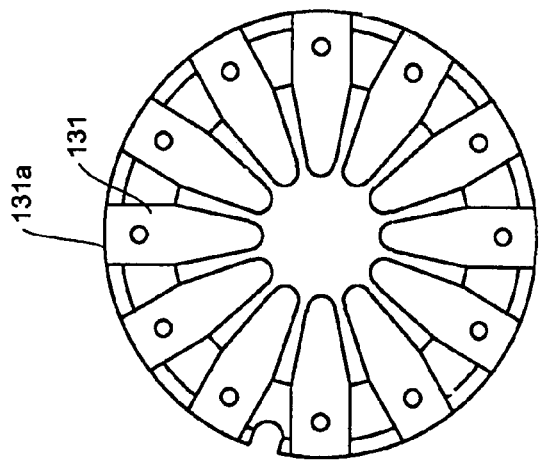
Figure 1H:
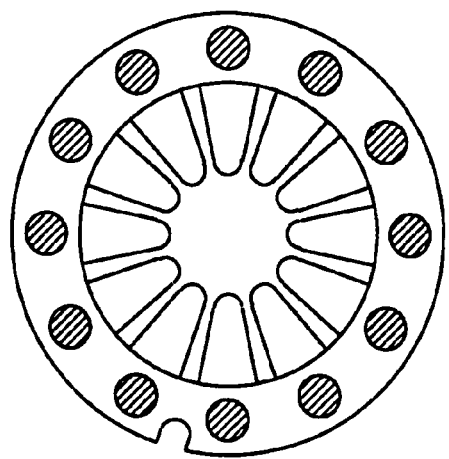
Figure 1G:
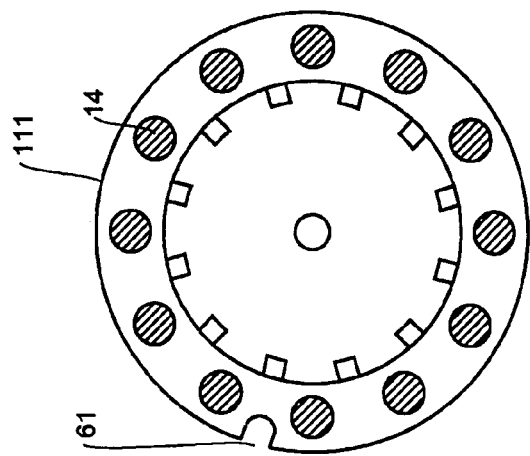

Step 6 is shown in FIG. 1(f). The epoxy resin curing agent 14 is injected into the injection holes which are laminated on top of each other by steps 1-5 and aligned in steps 2-5. Then, the curing agent is cured to fabricate an integrated blank member. FIGS. 1(g) through 1(i) illustrate other steps of the procedure for assembling the blank member.

A procedure for machining the blank member consists of steps 7 and 8 shown in FIG. 1(g) and FIG. 1(h), respectively. The blank member (see FIG. 1(c)) integrated by step 6 is set on a wire electric discharge machine (not shown), and the outer contour is machined. In the machining step performed in step 7, the shape of an arc 111 providing an assembly reference and the shape of a slot 61 are machined. In FIG. 1(g), the epoxy resin curing agent 14 has been injected in the injection holes. In the next step 8 shown in FIG. 1(h), the multipolar element is divided to shape the front-end forms of the polar elements by wire electric discharge machining subsequently to step 7. By the steps 1 to 8 described so far, the portion of the multipolar element that is placed inside a vacuum is fabricated.

As described so far, according to the present invention, the positional deviation between the front end of each polar element and the assembly reference can be reduced to a minimum by machining the front ends of the polar elements and the assembly reference of the multipolar element in one process step. The positional accuracy of the field produced by the multipolar element can be improved. Since the resinous film is used as the member for insulating the polar elements, the positional accuracy of the polar elements in the heightwise direction can be enhanced easily.

Figure 4A:
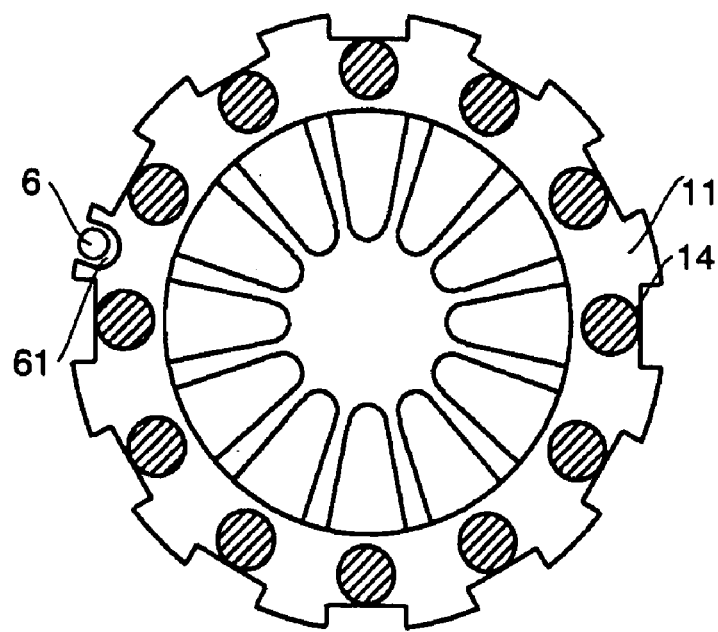
FIG. 4(a) is a top view of a multipolar element.
Figure 4B:
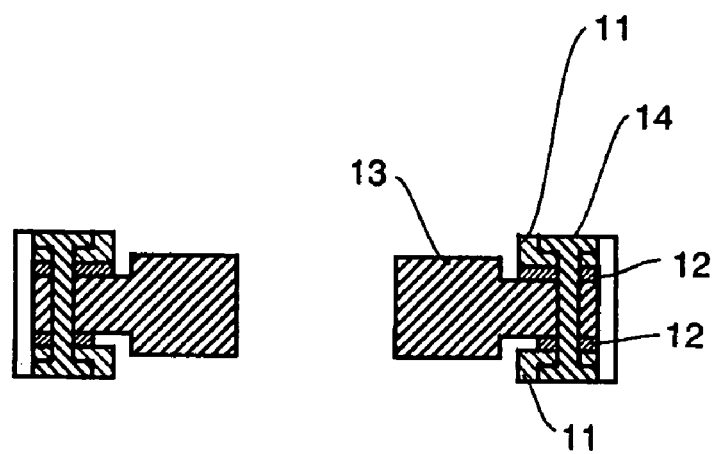
FIG. 4(b) is a vertical cross section of the multipolar element.

FIG. 1(i) is a horizontal cross section of the portion of the multipolar element that is installed inside a vacuum. The blank material 13 of the polar elements is divided to shape the front-end forms of polar elements 131 and terminal ends 131a of the polar elements. FIGS. 4(a) and 4(b) illustrate a subsequent procedure for assembling the blank member.

Figure 1L:
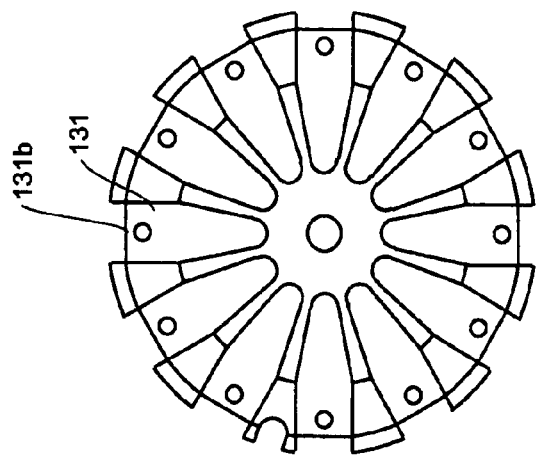
Figure 1K:
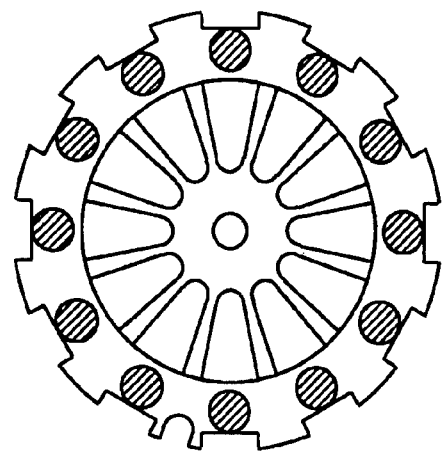
Figure 1J:
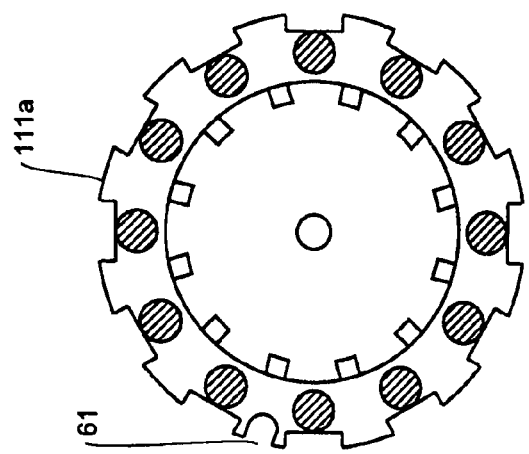
Figure 2A:
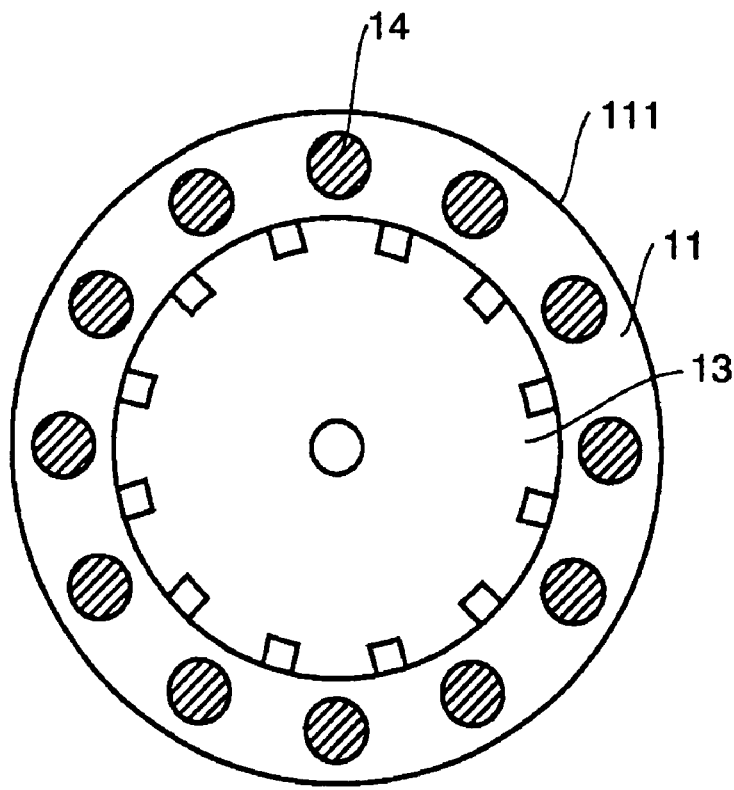
FIG. 2(a) is a top view of the blank member.
Figure 2B:
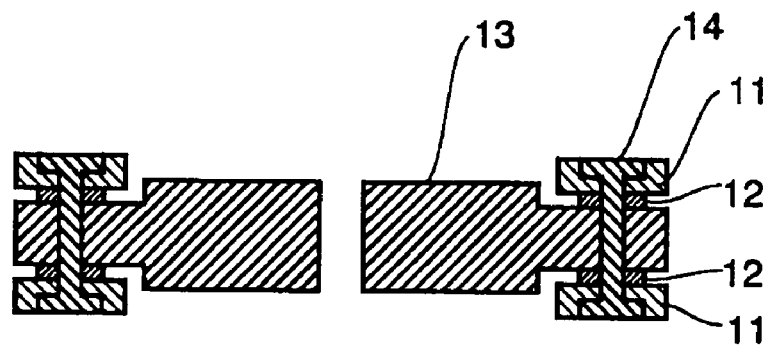
FIG. 2(b) is a vertical cross section of the blank member.

FIGS. 1(j) through 1(l) are top views of the integrated blank member. FIG. 2(b) is a vertical cross section of this blank member. Like components are indicated by like reference numerals in FIGS. 1(a) through 1(l) and FIGS. 2(a) and 2(b).

Figure 3A:
FIGS. 3(a) through 3(f) illustrate a procedure for stacking components of the blank member.
Figure 3A:
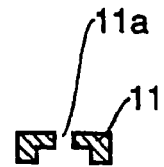
Figure 3B:
Figure 3B:
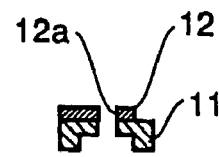
Figure 3C:
Figure 3C:
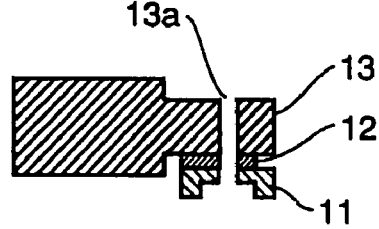
Figure 3D:
Figure 3D:
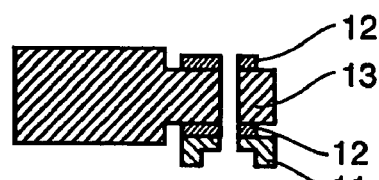
Figure 3E:
Figure 3E:
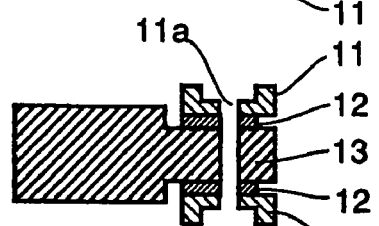
Figure 3F:
Figure 3F:
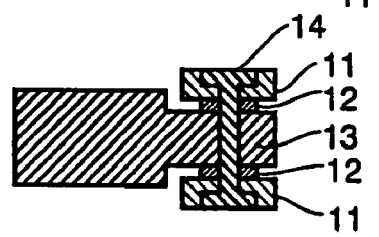

FIGS. 3(a) through 3(f) illustrate a procedure for stacking the components of the blank member, and are vertical cross sections of the integrated blank member. The first ring 11 is placed as shown in FIG. 3(a). The first insulator 12 is stacked on the ring 11 as shown in FIG. 3(b). Then, the blank material 13 from which polar components will be fabricated is placed on the insulator 12 as shown in FIG. 3(c). The second insulator 12 is placed on the blank material 13 as shown in FIG. 3(d). The second ring 11 is placed on the second insulator 12 as shown in FIG. 3(e). Under this condition, the holes formed in the various layers need to be aligned as shown in FIG. 3(e). After the layers are formed as shown in FIG. 3(e), the epoxy resin curing agent 14 is injected into the holes and cured. As a result, the shown blank member is integrally molded.

As described so far, according to Embodiment 1, the film thickness of the layers of film-like insulator 12 can be made uniform more easily than where insulators are formed by mechanical machining. The layers of insulator 12 electrically insulate the polar elements 131 and suppress variations in heightwise position between the polar elements 131.

In addition, the accuracy at which the axes of the polar elements and their azimuthal orientations are aligned can be secured by machining the arc 111 of the assembly reference, the slot 61, and the shapes of the front ends of the polar elements by a series of electric discharge machining operations without replacing the blank member. The arc 111 defines the outer periphery. The shapes of the front ends define the inner shape.

Embodiment 2

A blank member is fabricated by steps 1-6 already described in connection with FIGS. 1(a) through 1(l) in the same way as in Embodiment 1. A procedure of machining the blank member is described by referring to the plan views of FIG. 1(j) and FIG. 1(k). FIG. 1(j) and FIG. 1(k) illustrate steps 7 and 8, respectively. The blank member integrated by step 6 is set on a wire electric discharge machine (not shown) and the outer contour is machined. Because of this machining step, the discontinuous shapes of arcs 111a providing an assembly reference, slot 61, and terminal ends of the polar elements are machined.

In step 8, the multipolar element is divided by wire electric discharging subsequently to step 7, and the shapes of front ends of polar elements are formed. The portion of the multipolar element which is placed in a vacuum is completed. FIG. 1(l) is a horizontal cross section of the portion of the multipolar element which is placed in a vacuum, and shows the manner in which a blank material 13 of the polar elements is divided into polar elements 131 having shaped front ends and terminal ends 131b. In the same way as in Embodiment 1, a top view and a vertical cross section of the blank member are shown in FIGS. 2(a) and 2(b). A procedure of stacking the components of the blank member is illustrated in FIGS. 3(a) through 3(f).

FIG. 4(a) is a top view of a multipolar element. FIG. 4(b) is a vertical cross section of the portion of the multipolar element which is placed in a vacuum after wire electric discharge machining. In FIG. 4(a), a ring 11 is provided with a positioning slot 61. A pin 6 is fitted in the slot 61.

Figure 5:
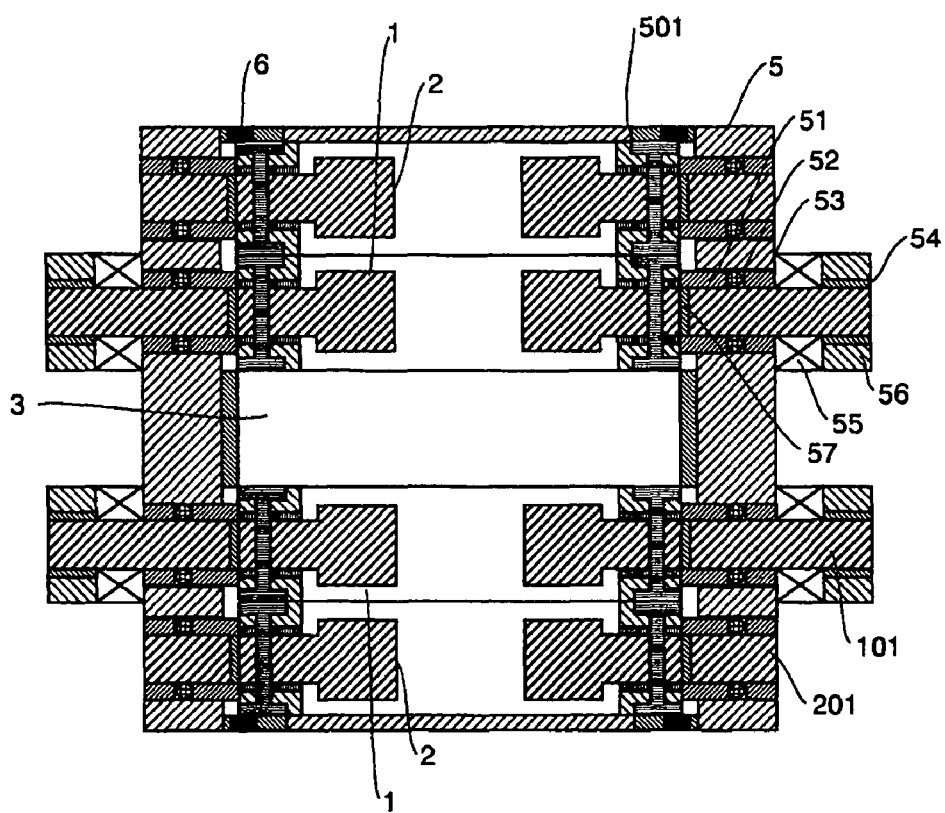
FIG. 5 is a vertical cross section of a multipole lens.

FIG. 5 is a vertical cross section of a multipolar lens. A housing 5 has an inner cylinder 501. Assembly reference arcs 111 (see FIG. 1(g)) of a first multipolar element 1 and a second multipolar element 2 are fitted in the cylinder 501. The multipolar element 1 produces a superimposition of electric and magnetic fields. The multipolar element 2 produces only an electric field. These multipolar elements and a spacer 3 (if necessary) are inserted inside the cylinder 501. The inserted multipolar elements are aligned in azimuthal orientation by a pin 6 inserted in the slot 61. This condition is shown in FIG. 4(*a*).

The housing 5 is provided with holes extending through it. These holes are formed in positions aligned with the positions at which the multipolar elements 1 and 2 are mounted. Cores 101 and contact pins 201 are inserted in the holes and electrically insulated from the housing 5 by insulators 51 and 53. The cores 101 and contact pins 201 are hermetically sealed by O-rings 52. The cores 101 make contact with the polar elements of the multipolar element 1 via conductive and nonmagnetic spacers 57. The cores 101 make electrical contact with the polar elements while maintaining magnetic spaces in the contacting portions.

The contact pins 201 make electrical contact with the polar elements of the multipolar element 2. A coil 55 is wound around each core 101. A yoke 56 is mounted via insulators 54. A magnetic circuit is formed. An electrical current is supplied to the coils 55 from an electric circuit (not shown). A magnetic field is set up in the space located inside the multipolar element 1. A voltage is applied to the cores 101 and contact pins 201 from an electric circuit (not shown) to produce an electric field in the space located inside the multipolar elements 1 and 2. The operation of the apparatus constructed in this way is described below.

1) The magnetic resistance of the portions of the polar elements making contact with the cores 101 placed in contact with the terminal ends 131*b* (see FIG. 1(*l*)) is reduced by machining the terminal ends 131*b* planarly. Also, variations in magnetic resistance between the polar elements can be reduced.

2) Variations in magnetic resistance between the contact portions can be reduced by bringing the front ends of the cores 101 into contact with the terminal ends 131*b* of the polar elements via the spacers 57.

3) The effect 2) above can also be obtained from the terminal ends 131*a* (see FIG. 1(*i*)) of Embodiment 1.

Embodiment 3

Two or more slots are formed by a machining step. The number of the slots is less than the number of the polar elements. Thus, any one of the slots which gives a high positional accuracy with the azimuthal orientation of the polar elements can be selected during assembly, and the accuracy of the azimuthal angle of the polar elements can be improved.

Embodiment 4

The front end of each core 101 is machined spherically or conically and brought into contact with terminal ends 131*a* or 131*b* of the polar elements. Thus, variations in magnetic resistance between the portions which make contact with the terminal ends 131*a* or 131*b* can be reduced.

Embodiment 5

Figure 6A:
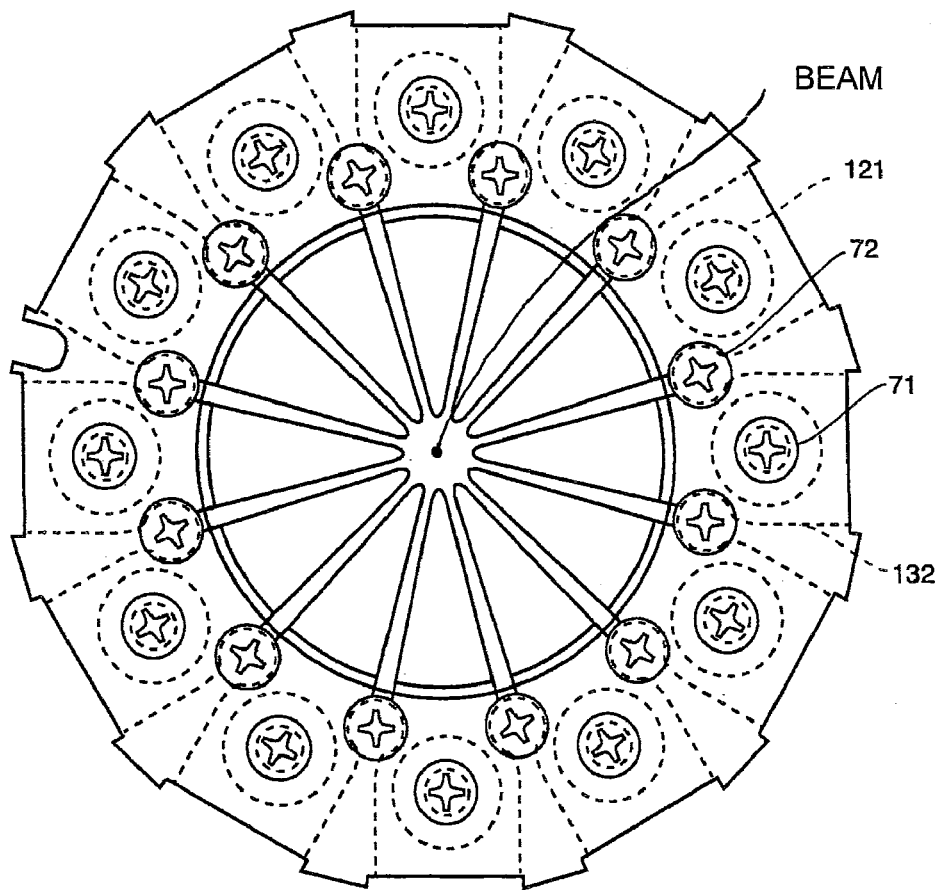
FIG. 6(a) is a plan view of a multipolar element.
Figure 6B:
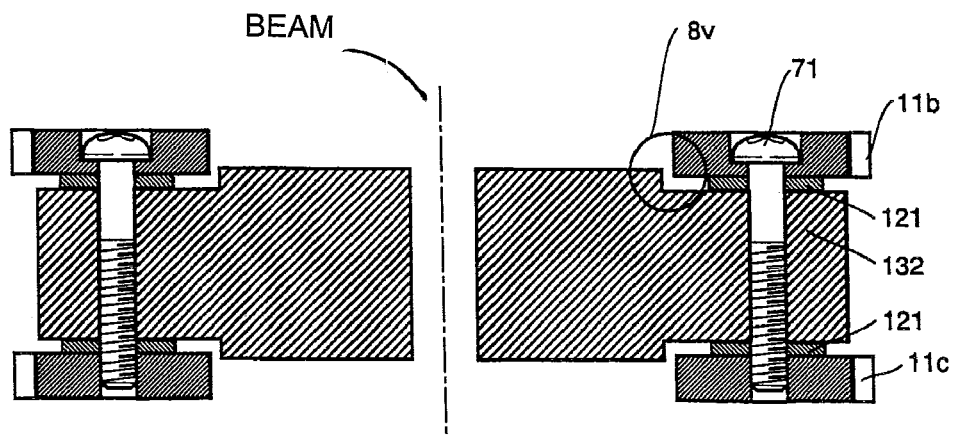
FIG. 6(b) is a vertical cross section of the multipolar element.
Figure 7:
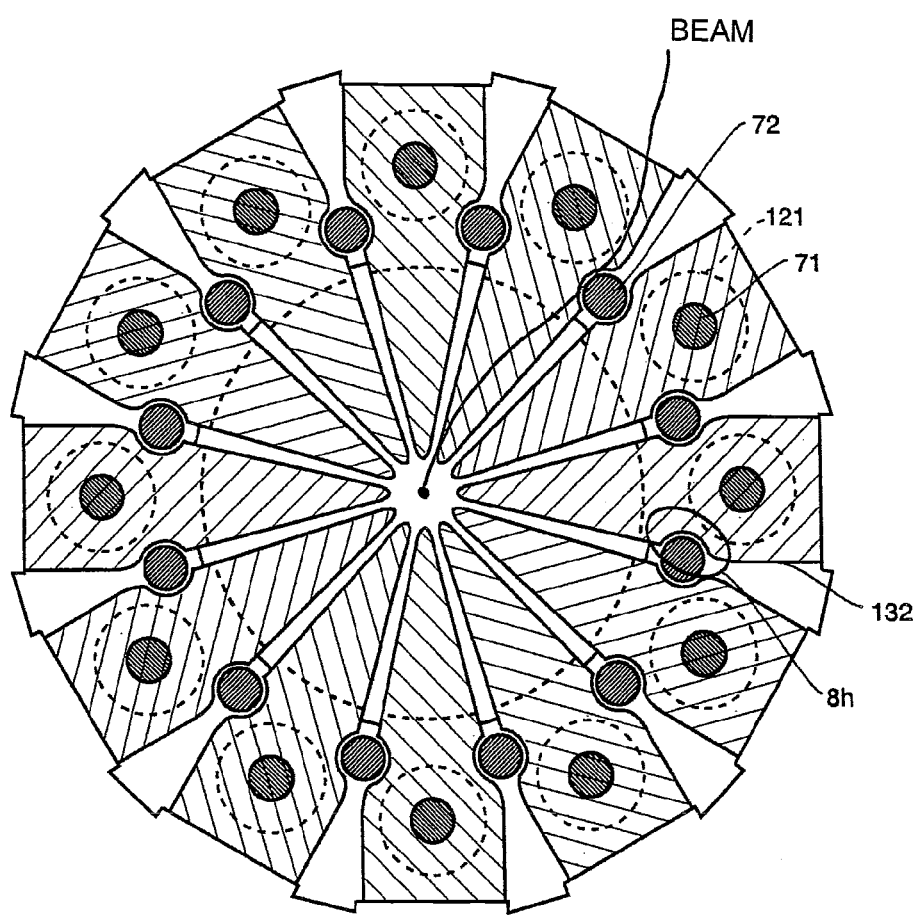
FIG. 7 is a horizontal cross section of the multipolar element.

A case in which screws are used as means for integrating various members instead of a curing agent, such as epoxy resin curing agent, is now described. FIG. 6(*a*) is a plan view of a multipolar element. FIG. 6(*b*) is a vertical cross section of the multipolar element. FIG. 7 is a horizontal cross section of the multipolar element. Each polar element 132 is sandwiched between rings 11*b* and 11*c* via an insulator 121 and tightened by screws 71 and 72. The screws 71 are mounted to fix the polar elements. The screws 72 are mounted to cooperate with the screws 71 to absorb moment applied to the polar elements. The operation of the multipole lens constructed in this way is described below.

When particles are sputtered by particles scattered by a beam of charged particles and adhere to the surface of the insulator, the resistance of the surface of the insulator decreases, producing poor insulation. To prevent this, it is necessary to arrange the insulator and metal members close to the insulator such that the beam of charged particles cannot view the insulator or metal members.

The labyrinth structure 8*v* shown in FIG. 6(*b*) and the labyrinth structure 8*h* shown in FIG. 7 operate in this way. Especially, in the labyrinth structure 8*h*, the screws 72 used for tightening act also as a function of a labyrinth structure; any extra member for achieving the labyrinth structure is not prepared.

As described so far, according to Embodiment 5, the various layers can be fixed with screws during fabrication of the multipole lens instead of curing agent that is cured. Furthermore, the labyrinth structure that disables the beam of charged particles from viewing the insulator or metal materials close to the insulator can be imparted to the screws.

In the embodiments described so far, an epoxy resin curing agent is taken as an example of curing agent. The present invention is not limited to this. Other kinds of curing agents can also be used.

The advantages of the present invention described so far are enumerated as follows.

1) Positional deviation between the front ends of a multipolar element and the assembly reference can be reduced to a minimum by machining the front ends of the polar elements and the assembly reference for the multipolar element in one process step. The positional accuracy of the field produced by the multipolar element can be improved.

2) The positional accuracy of the polar elements in the heightwise direction can be easily enhanced by using resinous film as a member for insulating the polar elements.

3) The front end of each polar element and the corresponding core are fabricated as separate parts. Thus, they are separated from each other. Therefore, the reaction forces in the bending direction from the hermetic sealing member, yoke, and magnetically coupled portions does not act on the front ends of the polar elements. Deterioration of the accuracy of the front ends of the polar elements due to the reaction forces can be prevented.

4) By inserting nonmagnetic metal foil or metal sheet in the portions where the polar elements and the cores are magnetically coupled, variations in magnetic resistance between these portions can be reduced.

5) By curvilinearly or spherically shaping the cores in the portions where the polar elements and cores are magnetically coupled, variations in magnetic resistance between these portions can be reduced.

6) By conically shaping the cores in the portions where the polar elements and cores are magnetically coupled, variations in magnetic resistance between these portions can be reduced.

7) Because of the effect 4), 5) or 6), the polar elements can be magnetically excited by coils connected in series.

8) Where the multipolar element is assembled with screws, a function of a labyrinth structure for disabling a beam of charged particles from viewing insulating members can be imparted to the screws by arranging the screws between polar elements. There arises the advantage that it is not necessary to prepare separate members having the labyrinth structure.

Having thus described my invention with the detail and particularity required by the Patent Laws, what is desired protected by Letters Patent is set forth in the following claims.

The invention claimed is:

1. A multipole lens comprising:
    a disk-shaped blank material from which polar elements will be fabricated;
    layers of film-like insulating material between which the blank material is sandwiched;
    rings between which the blank material and the layers of film-like insulating material are sandwiched vertically;
    injection holes formed in all of the blank material, the layers of film-like insulating material, and the rings, the injection holes being used for injection of a curing agent, the injection holes being aligned; and
    the polar elements being fabricated from the blank material by electric discharge machining after curing of the curing agent.

2. A multipole lens as set forth in claim 1, wherein said polar elements have terminal ends machined planarly.

3. A multipole lens as set forth in claim 1, wherein each of said rings has at least one positioning slot.

4. A multipole lens as set forth in claim 1, further comprising:
    a cylindrically arranged housing provided with through-holes and disposed outside the polar elements; and
    cores having front ends machined spherically or conically, the front ends being in contact with terminal ends of the polar elements via the through-holes.

5. A multipole lens as set forth in claim 1, wherein said injection holes for injection of the curing agent are threaded holes, and wherein the multipole lens is fixed with metal screws instead of the curing agent.

6. A multipole lens as set forth in claim 5, wherein the insulating material and metal screws disposed close to the insulating material are so arranged that a beam of charged particles can view none of the insulating material and the metal screws.

7. A method of fabricating a multipole lens, comprising the steps of:
    placing a first layer of film-like insulating material over a first ring;
    preparing a blank material from which polar elements will be fabricated;
    placing the blank material over the first layer of film-like insulating material;
    placing a second layer of film-like insulating material over the blank material;
    placing a second ring over the second layer of film-like insulating material;
    forming layers from these first layer of film-like insulating material, blank material, second layer of film-like insulating material, and second ring such that holes formed in these layers are aligned;
    injecting a curing agent into the holes and curing the curing agent; and
    then machining the blank material by electric discharge machining to form the polar elements.

* * * * *